(12) United States Patent
Yamashita et al.

(10) Patent No.: US 7,426,152 B2
(45) Date of Patent: *Sep. 16, 2008

(54) SEMICONDUCTOR MEMORY DEVICE AND SEMICONDUCTOR DEVICE

(75) Inventors: Masahiro Yamashita, Kodaira (JP); Takashi Uehara, Takaraduka (JP); Mamoru Takaku, Tamamura (JP); Hiroaki Nambu, Sagamihara (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/826,751

(22) Filed: Jul. 18, 2007

(65) Prior Publication Data

US 2007/0274139 A1 Nov. 29, 2007

Related U.S. Application Data

(63) Continuation of application No. 11/391,226, filed on Mar. 29, 2006, now Pat. No. 7,269,086.

(30) Foreign Application Priority Data

Mar. 29, 2005 (JP) ............................. 2005-093494

(51) Int. Cl.
*G11C 5/14* (2006.01)

(52) U.S. Cl. ..................... 365/226; 365/225.7; 365/154

(58) Field of Classification Search ................. 365/191, 365/154, 156, 226, 225.7
See application file for complete search history.

(56) References Cited

U.S. PATENT DOCUMENTS

| | | | |
|---|---|---|---|
| 5,361,001 A | 11/1994 | Stolfa | |
| 6,157,241 A | 12/2000 | Hellums | |
| 6,396,759 B1 | 5/2002 | Lesher | |
| 6,462,609 B2 | 10/2002 | Hashimoto et al. | |
| 6,535,447 B2 | 3/2003 | Kim et al. | |
| 6,865,117 B2 * | 3/2005 | Kozicki | 365/189.09 |
| 7,038,523 B2 | 5/2006 | Kim et al. | |

FOREIGN PATENT DOCUMENTS

JP 2003-242799 2/2002

* cited by examiner

*Primary Examiner*—Huan Hoang
(74) *Attorney, Agent, or Firm*—Reed Smith LLP; Stanley P. Fisher, Esq.; Juan Carlos A. Marquez, Esq.

(57) ABSTRACT

A technology capable of improving the yield by the trimming of internal properties of a semiconductor device is provided. A semiconductor device is provided with an internal voltage step-down circuit and an internal voltage step-up circuit whose property values (internal voltage and others) are variable, a fuse circuit unit, a JTAG function unit 304 which inputs and retains signals from outside, a control circuit which perform logical operation based on an output signal of the fuse circuit unit and an output signal of the JTAG function unit, and the property values of the internal voltage step-down circuit and the internal voltage step-up circuit are controlled based on a result of the logical operation by the control circuit.

7 Claims, 21 Drawing Sheets

DELAY TIME
TRIMMING CONTROL SIGNAL

FIG. 22

| CONTROL METHOD | SETTING (GRADE) | FUSE CUTTING CODE | | | | |
|---|---|---|---|---|---|---|
| | | FRGC0 | FRGC1 | FRGC2 | FRGC3 | FRGC4 |
| FUSE CUT | G0 | 0 | 0 | 0 | 0 | 1 |
| | G1 | 1 | 0 | 0 | 0 | 1 |
| | G2 | 0 | 1 | 0 | 0 | 1 |
| | G3 | 1 | 1 | 0 | 0 | 1 |
| | G4 | 0 | 0 | 1 | 0 | 1 |
| | G5 | 1 | 0 | 1 | 0 | 1 |
| | G6 | 0 | 1 | 1 | 0 | 1 |
| | G7 | 1 | 1 | 1 | 0 | 1 |
| | G8 | 0 | 0 | 0 | 1 | 1 |
| | G9 | 1 | 0 | 0 | 1 | 1 |
| | G10 | 0 | 1 | 0 | 1 | 1 |
| | G11 | 1 | 1 | 0 | 1 | 1 |
| | G12 | 0 | 0 | 1 | 1 | 1 |
| | G13 | 1 | 0 | 1 | 1 | 1 |
| | G14 | 0 | 1 | 1 | 1 | 1 |
| | G15 | 1 | 1 | 1 | 1 | 1 |
| | G16 | 0 | 0 | 0 | 0 | 0 |
| | G17 | 1 | 0 | 0 | 0 | 0 |
| | G18 | 0 | 1 | 0 | 0 | 0 |
| | G19 | 1 | 1 | 0 | 0 | 0 |
| | G20 | 0 | 0 | 1 | 0 | 0 |
| | G21 | 1 | 0 | 1 | 0 | 0 |
| | G22 | 0 | 1 | 1 | 0 | 0 |
| | G23 | 1 | 1 | 1 | 0 | 0 |
| | G24 | 0 | 0 | 0 | 1 | 0 |
| | G25 | 1 | 0 | 0 | 1 | 0 |
| | G26 | 0 | 1 | 0 | 1 | 0 |
| | G27 | 1 | 1 | 0 | 1 | 0 |
| | G28 | 0 | 0 | 1 | 1 | 0 |
| | G29 | 1 | 0 | 1 | 1 | 0 |
| | G30 | 0 | 1 | 1 | 1 | 0 |
| | G31 | 1 | 1 | 1 | 1 | 0 |

FIG. 23

| VDDI TRIMMING CODE SHIFT | SHIFT GRADE NUMBER -:Down +:UP | JTAG SHIFT CODE (Reg.#) | | | | | | REMARKS | FUSE CUT GRADE | NUMBER OF GRADES THAT CAN BE SHIFTED | |
|---|---|---|---|---|---|---|---|---|---|---|---|
| | | #1 JRGCEN | #2 JRGC0 | #3 JRGC1 | #4 JRGC2 | #5 JRGC3 | #6 JRGC4 | | | − (Down SIDE) | + (Up SIDE) |
| | −16 | L | L | L | L | L | L | | G0 | UNABLE | +15 |
| | −15 | L | H | L | L | L | L | | G1 | −1 | +15 |
| | −14 | L | L | H | L | L | L | | G2 | −2 | +15 |
| | −13 | L | H | H | L | L | L | | G3 | −3 | +15 |
| | −12 | L | L | L | H | L | L | | G4 | −4 | +15 |
| | −11 | L | H | L | H | L | L | | G5 | −5 | +15 |
| | −10 | L | L | H | H | L | L | | G6 | −6 | +15 |
| | −9 | L | H | H | H | L | L | | G7 | −7 | +15 |
| | −8 | L | L | L | L | H | L | | G8 | −8 | +15 |
| | −7 | L | H | L | L | H | L | | G9 | −9 | +15 |
| | −6 | L | L | H | L | H | L | | G10 | −10 | +15 |
| | −5 | L | H | H | L | H | L | | G11 | −11 | +15 |
| | −4 | L | L | L | H | H | L | | G12 | −12 | +15 |
| | −3 | L | H | L | H | H | L | | G13 | −13 | +15 |
| | −2 | L | L | H | H | H | L | | G14 | −14 | +15 |
| | −1 | L | H | H | H | H | L | | G15 | −15 | +15 |
| | 0 | L | L | L | L | L | H | default (CODE THROUGH) | G16 | −16 | +15 |
| | 1 | L | H | L | L | L | H | | G17 | −16 | +14 |
| | 2 | L | L | H | L | L | H | | G18 | −16 | +13 |
| | 3 | L | H | H | L | L | H | | G19 | −16 | +12 |
| | 4 | L | L | L | H | L | H | | G20 | −16 | +11 |
| | 5 | L | H | L | H | L | H | | G21 | −16 | +10 |
| | 6 | L | L | H | H | L | H | | G22 | −16 | +9 |
| | 7 | L | H | H | H | L | H | | G23 | −16 | +8 |
| | 8 | L | L | L | L | H | H | | G24 | −16 | +7 |
| | 9 | L | H | L | L | H | H | | G25 | −16 | +6 |
| | 10 | L | L | H | L | H | H | | G26 | −16 | +5 |
| | 11 | L | H | H | L | H | H | | G27 | −16 | +4 |
| | 12 | L | L | L | H | H | H | | G28 | −16 | +3 |
| | 13 | L | H | L | H | H | H | | G29 | −16 | +2 |
| | 14 | L | L | H | H | H | H | | G30 | −16 | +1 |
| | 15 | L | H | H | H | H | H | | G31 | −16 | UNABLE |

SEMICONDUCTOR MEMORY DEVICE AND SEMICONDUCTOR DEVICE

CROSS-REFERENCE TO RELATED APPLICATION

This application is a Continuation Application of U.S. application Ser. No. 11/391,226 filed Mar. 29, 2006 now U.S. Pat. No. 7,269,086. Priority is claimed based on U.S. application Ser. No. 11/391,226 filed Mar. 29, 2006, which claims the priority of Application No. JP 2005-093494 filed on Mar. 29, 2005, all of which is incorporated by reference.

TECHNICAL FIELD OF THE INVENTION

The present invention relates to a semiconductor device. More particularly, the present invention relates to a technology effectively applied to a trimming technology for internal properties of the device.

BACKGROUND OF THE INVENTION

According to the studies by the inventors of the present invention, the following technologies are known in the field of a semiconductor device such as a SRAM (Static Random Access Memory).

Most of current SRAMs incorporate a voltage step-down circuit, and internal circuits of the SRAM are operated by the internal voltage obtained by stepping-down the external voltage in this voltage step-down circuit. This internal voltage is an important voltage because it influences the stability of the operation of the internal circuits. Therefore, in the sorting process before the shipment of the packaged products, the evaluation of the internal voltage is performed while changing the internal properties through the pseudo trimming by the JTAG function (IEEE standard 1149.1 proposed by Joint Test Action Group) so as to screen the samples with small margin (Japanese Patent Application Laid-Open Publication No. 2003-242799 (Patent document 1)).

The invention described in patent document 1 enables the trimming after sealing the semiconductor chip into a package. More specifically, control means for switching the trimming mode and the evaluation mode for the internal circuits is provided, this control means includes a control unit which can perform the mode switching control of the trimming mode and the evaluation mode through the method of JTAG, and the control unit includes a command decoding unit for decoding the inputted command, a shift scan register group for performing the boundary scan based on the decoding results in the command decoding unit, and an operation control unit for controlling the operation of the command decoding unit and the shift register. In this structure, the trimming after sealing the semiconductor chip into a package can be achieved.

SUMMARY OF THE INVENTION

Incidentally, as a result of the studies for the trimming technology described above by the inventors of the present invention, the following matters have been found out.

When the invention described in patent document 1 is used, in the sorting process before the shipment of the packaged products, the evaluation is performed while changing the internal voltage stepped down by the voltage step-down circuit through the pseudo trimming by the JTAG function, and the samples with small margin can be screened.

Meanwhile, in recent years, due to the reduction in process dimensions in the semiconductor process, the variation in properties of the transistors due to the manufacturing errors has been more and more significant, and the variation in voltage generated by the voltage step-down circuit has been increased. Therefore, this internal voltage is measured in the stage of the wafer test, and when the measured value is deviated from the design value due to the variation in properties of the transistors, the internal voltage is adjusted so as to be close to the design value by means of the fuse trimming.

However, when the evaluation is performed while changing the internal voltage through the trimming by the JTAG function, the adjustment result of the internal voltage by the fuse trimming is not considered in the subsequent sorting process, and the fuse trimming and the trimming by the JTAG function are independently performed.

More specifically, the result of adjustment for the variation in voltage generated by the voltage step-down circuit due to the variation in properties of the transistors is not reflected on the sorting process, and not only it is difficult to screen the samples with small margin, but also the yield is degraded.

When the trimming by the JTAG function is used to perform plural sorting processes in parallel based on the invention described in patent document 1, since the adjustment for the variation in internal voltage which differs in each sample is not considered as described above, the trimming by the JTAG function has to be individually performed to each sample in order to give the same trimming conditions to all samples. As a result, the sorting process is complicated.

In such a circumstance, an object of the present invention is to provide a technology capable of improving the yield by means of trimming in a semiconductor memory device or a semiconductor device.

The above and other objects and novel characteristics of the present invention will be apparent from the description of this specification and the accompanying drawings.

The typical ones of the inventions disclosed in this application will be briefly described as follows.

More specifically, a semiconductor memory device and a semiconductor device in which the trimming of the properties by the JTAG function can be performed according to the present invention comprise: a first circuit whose property values are variable; a program element; a second circuit which inputs and retains a signal from outside; and a third circuit which performs a logical operation based on an output signal of the program element and an output signal of the second circuit, wherein the property values of the first circuit are controlled based on a result of the logical operation of the third circuit.

The effects obtained by typical aspects of the present invention will be briefly described below.

(1) When property values such as an internal voltage and others are measured in the stage of the wafer test and the measured values are deviated from the design value due to the variation in properties of the transistors, the property value is adjusted so as to be close to the design value by means of the fuse trimming, and the trimming by the JTAG function in which the result of the adjustment is reflected can be performed.

(2) In the sorting process, the evaluation can be performed while changing property values such as an internal voltage and others by the trimming signals by the JTAG function in reflection of the adjustment of the property values by the fuse trimming, and thus, it is possible to improve the yield and to screen the samples with small margin.

(3) The parallel testing of a large number of samples (batch processing in a tester) can be easily realized.

BRIEF DESCRIPTIONS OF THE DRAWINGS

FIG. 22 is a diagram showing an internal voltage trimming table in the trimming circuit in FIG. 4; and FIG. 23 is a diagram showing an internal voltage JTAG shift code table in the trimming circuit in FIG. 4.

DESCRIPTIONS OF THE PREFERRED EMBODIMENTS

For easy understanding of the features of the present invention, the present invention will be described in comparison with the technology serving as the premise of the present invention.

(Premise of the Present Invention)

In order to solve the problem of the degradation of the yield described above, the method in which the internal voltage generated by the voltage step-down circuit is measured in the stage of the wafer test and when the measured value is deviated from the design value due to the variation in properties of the transistors, the internal voltage is adjusted so as to be close to the design value by means of the fuse trimming has been examined prior to the present invention.

Figure 1:
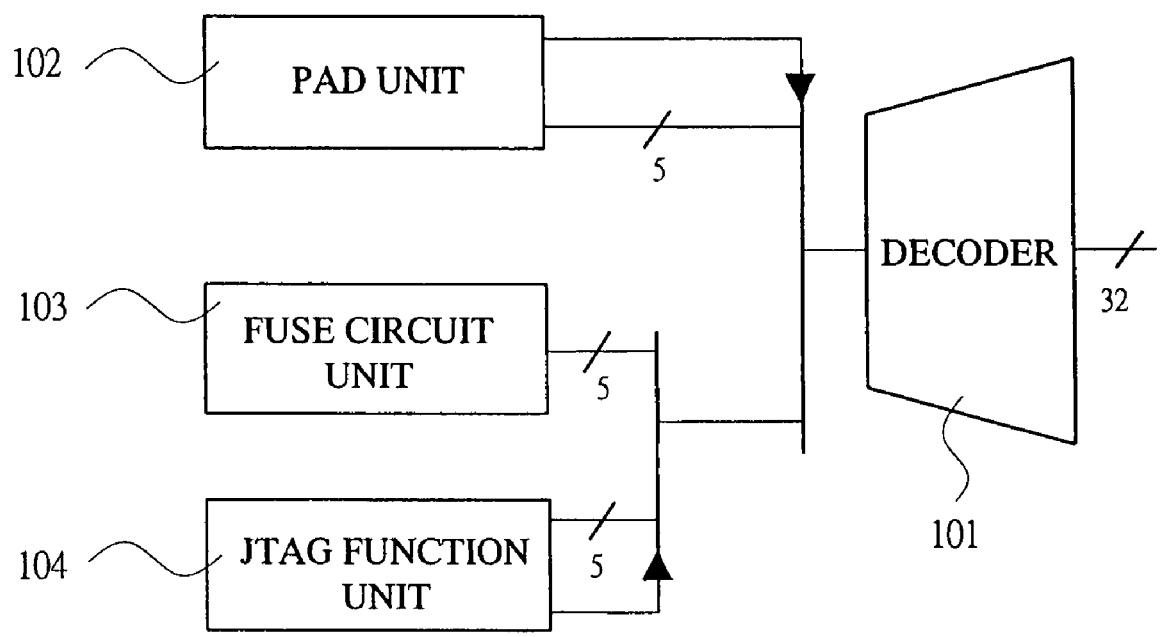
FIG. 1 is a diagram schematically showing a structure of a trimming circuit in a semiconductor device examined prior to the present invention.

FIG. 1 is a diagram schematically showing the structure of a trimming circuit in the semiconductor device examined prior to the present invention. In FIG. 1, a decoder 101 is a decoding circuit which switches the internal voltage generated by a voltage step-down circuit (though not shown, it is connected to the latter stage of the decoder 101) to 32 levels based on the 5-bit signals.

Therefore, in FIG. 1, the internal voltage can be switched to 32 levels by any one of the pad signal of the pad unit 102, the fuse signal of the fuse circuit unit 103, and the trimming signal of the JTAG function unit 104. Consequently, the internal voltage can be adjusted so as to be close to the design value by the fuse trimming in the stage of the wafer test.

Figure 2:
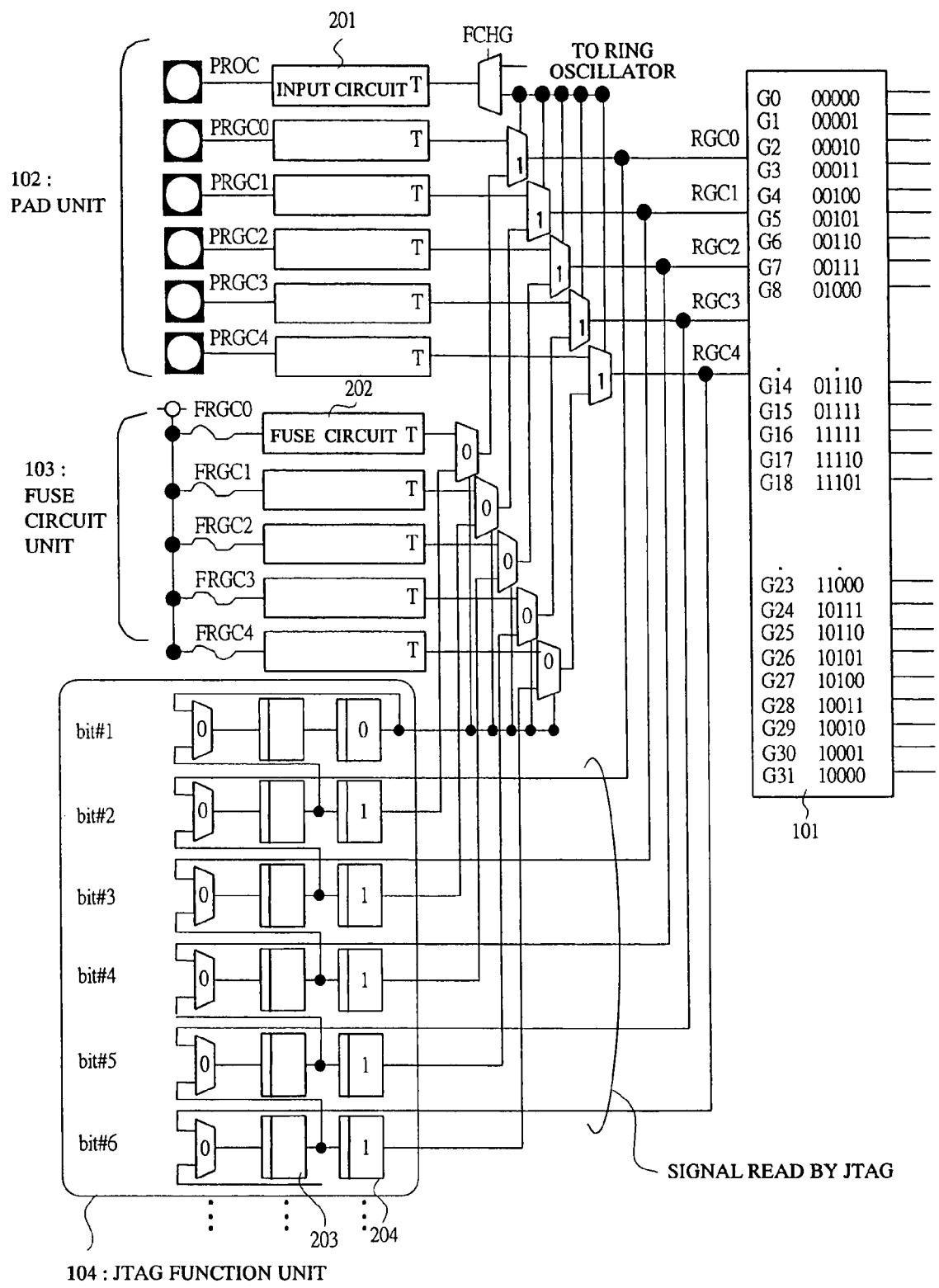
FIG. 2 is a diagram showing the structure of the trimming circuit in FIG. 1 in detail.

FIG. 2 is a diagram showing each of the blocks in FIG. 1 in detail. In FIG. 2, the pad unit 102 is composed of input circuits 201 of the pad signal, the fuse circuit unit 103 is composed of fuse circuits 202, and the JTAG function unit 104 is composed of shift scan registers 203 and update registers 204. Any one of the pad signal, the fuse signal, and the trimming signal by the JTAG function generated by each of the blocks is selected by a selector and the selected signal is inputted to the decoder 101. The decoder 101 generates the signals for switching the internal voltage generated from the voltage step-down circuit (G0 to G31) based on 5-bit signals (RGC0 to RGC4). In this manner, the internal voltage can be adjusted so as to be close to the design value by the fuse trimming in the stage of the wafer test.

However, when the fuse trimming is performed as described above, it is difficult to perform the evaluation while changing the internal voltage by the pseudo trimming by the JTAG function and to screen the samples with small margin in the subsequent sorting process. This is because of the two reasons below.

First, the size of margin of the samples subjected to the fuse trimming has to be evaluated while changing the internal voltage based on the internal voltage subjected to the fuse trimming. However, in the structure shown in FIG. 1, the trimming signal by the JTAG function is directly inputted to the decoder. Therefore, the evaluation is completely independent of the state after the fuse trimming.

Second, even when the information of the fuse trimming is fed back to the signal which controls the JTAG function and the trimming signal by the JTAG function can be generated based on the internal voltage subjected to the fuse trimming, such a feedback control is extremely complicated, and the reduction in manufacturing cost cannot be achieved because the parallel testing and sorting of a large number of samples to reduce the test time is difficult. More specifically, since the value of the fuse trimming (fuse trimming value) differs in each sample, the parallel testing of a large number of samples performed by supplying the common JTAG control signals cannot be performed in general.

Embodiment

For the solution of the problems described above, according to the embodiment of the present invention, in a semiconductor device provided with an internal voltage step-down circuit (voltage step-up circuit), a potential generated from the voltage step-down circuit (voltage step-up circuit) is made controllable based on the result of the logical operation of the signal outputted from the program element in the semiconductor device and the signal inputted from the outside of the semiconductor device.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 3:
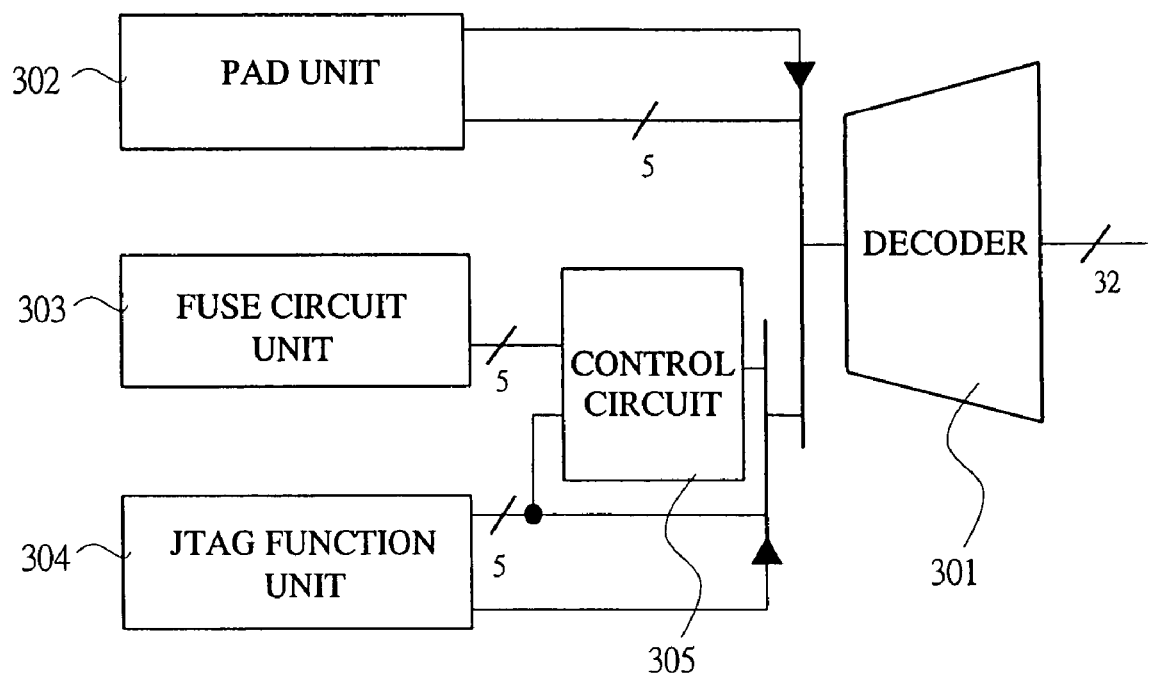
FIG. 3 is a diagram schematically showing a structure of a trimming circuit in a semiconductor device according to an embodiment of the present invention.

FIG. 3 is a diagram schematically showing the structure of the trimming circuit in the semiconductor device according to an embodiment of the present invention. The trimming circuit according to this embodiment is a circuit for adjusting the internal voltage of the internal voltage step-down circuit or the internal voltage step-up circuit as a first circuit, and it is composed of a decoder 301, a pad unit 302, a fuse circuit unit 303, a JTAG function unit 304 as a second circuit, and a control circuit 305 as a third circuit. The outputs of the fuse circuit 303 and the JTAG function circuit 304 are inputted to the control circuit 305, and the outputs of the control circuit 305, the JTAG function unit 304, and the pad unit 302 are inputted to the decoder 301 via a selector. Each of the signals has the 4-bit configuration. The signals (TCK, TMS, TDI) for the IEEE standard 1149.1 proposed by JTAG (Joint Test Action Group) are inputted to the JTAG function unit 304.

In the structure of FIG. 3, the control circuit 305 is additionally provided in comparison to the structure of FIG. 1. The control circuit 305 generates the control signal which can control the internal voltage based on the result of the logical operation of the fuse signal and the trimming signal by the JTAG function. More specifically, the control circuit 305 identifies the state of the fuse trimming performed in the stage of the wafer test, and based on the internal voltage in this state, it generates the control signal which changes the internal voltage by the trimming signal by the JTAG function.

Figure 4:
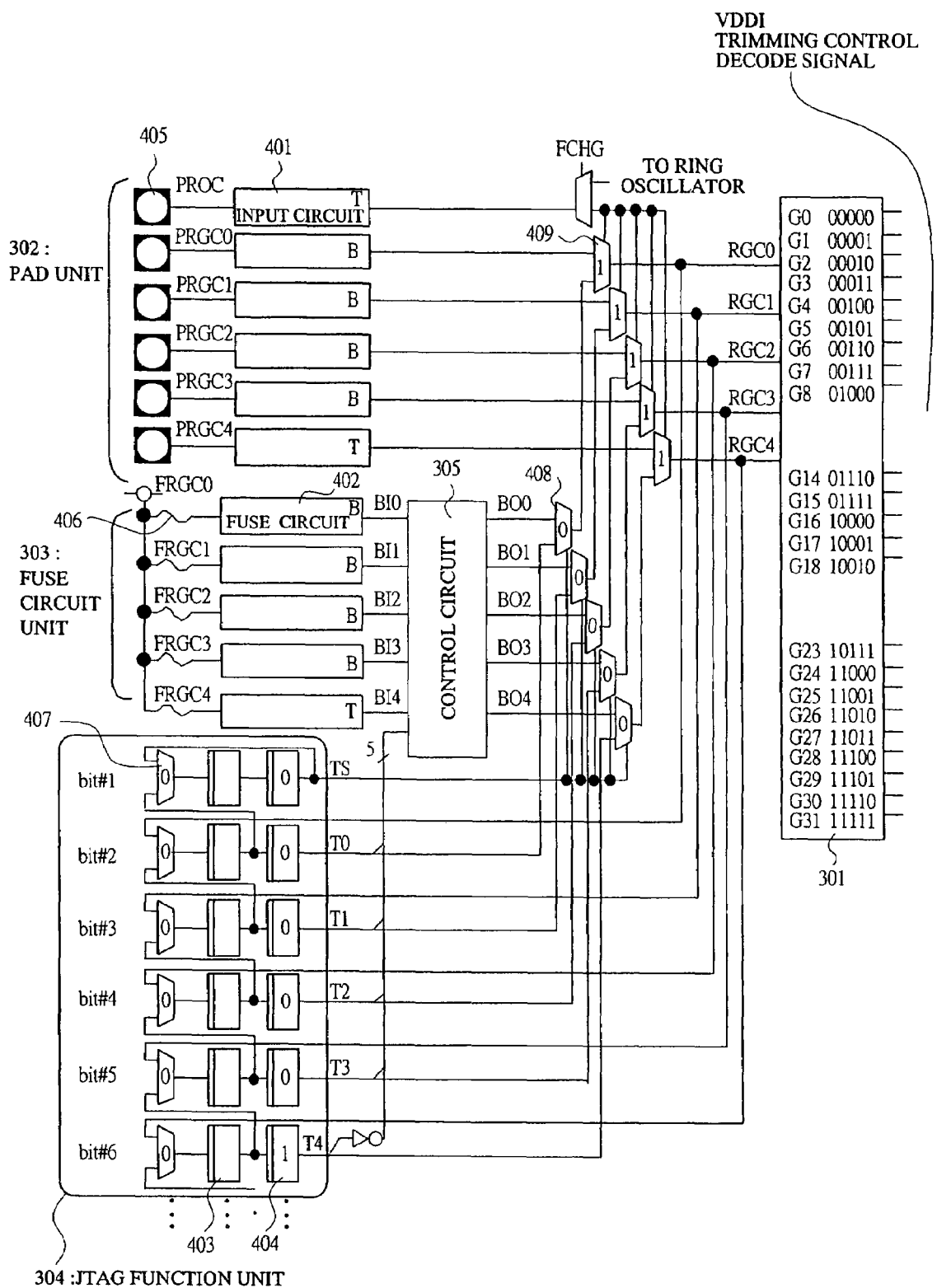
FIG. 4 is a diagram showing the structure of the trimming circuit in FIG. 3 in detail.

FIG. 4 is a diagram showing an example of the structure of each block in the trimming circuit shown in FIG. 3. The pad unit 302 is composed of a plurality of pads (PAD) 405 and a plurality of input circuits 401, and each pad 405 is connected to the input circuit 401. The fuse circuit unit 303 is composed of a plurality of fuses 406 and a plurality of fuse circuits 402, and one end of each fuse 406 is connected to a power supply and the other end thereof is connected to each fuse circuit 402. The JTAG function unit 304 is composed of a plurality of selectors 407, a plurality of shift scan registers 403, and a plurality of update registers 404, an output of each selector 407 is inputted to each shift scan register 403, an output of each shift scan register 403 is inputted to each update register 404 and each selector 407, and an output of each update register 404 is inputted to the control circuit 305. Also, outputs of the control circuit 305 and an output of each update register 404 are inputted to a plurality of registers 408, an output of each selector 408 and an output of each input circuit 401 are inputted to each selector 409, and an output of each selector 409 is inputted to the decoder 301 and each selector 407.

In this embodiment, the control circuit 305 shown in FIG. 3 functions as a bit shift circuit. The control circuit 305 performs the bit shift for the output reference signals (B10 to B14) from the fuse circuits 402 with the trimming signals (T0 to T4) from the JTAG function unit 304, and it inputs the results to the decoder 301.

Figure 5:
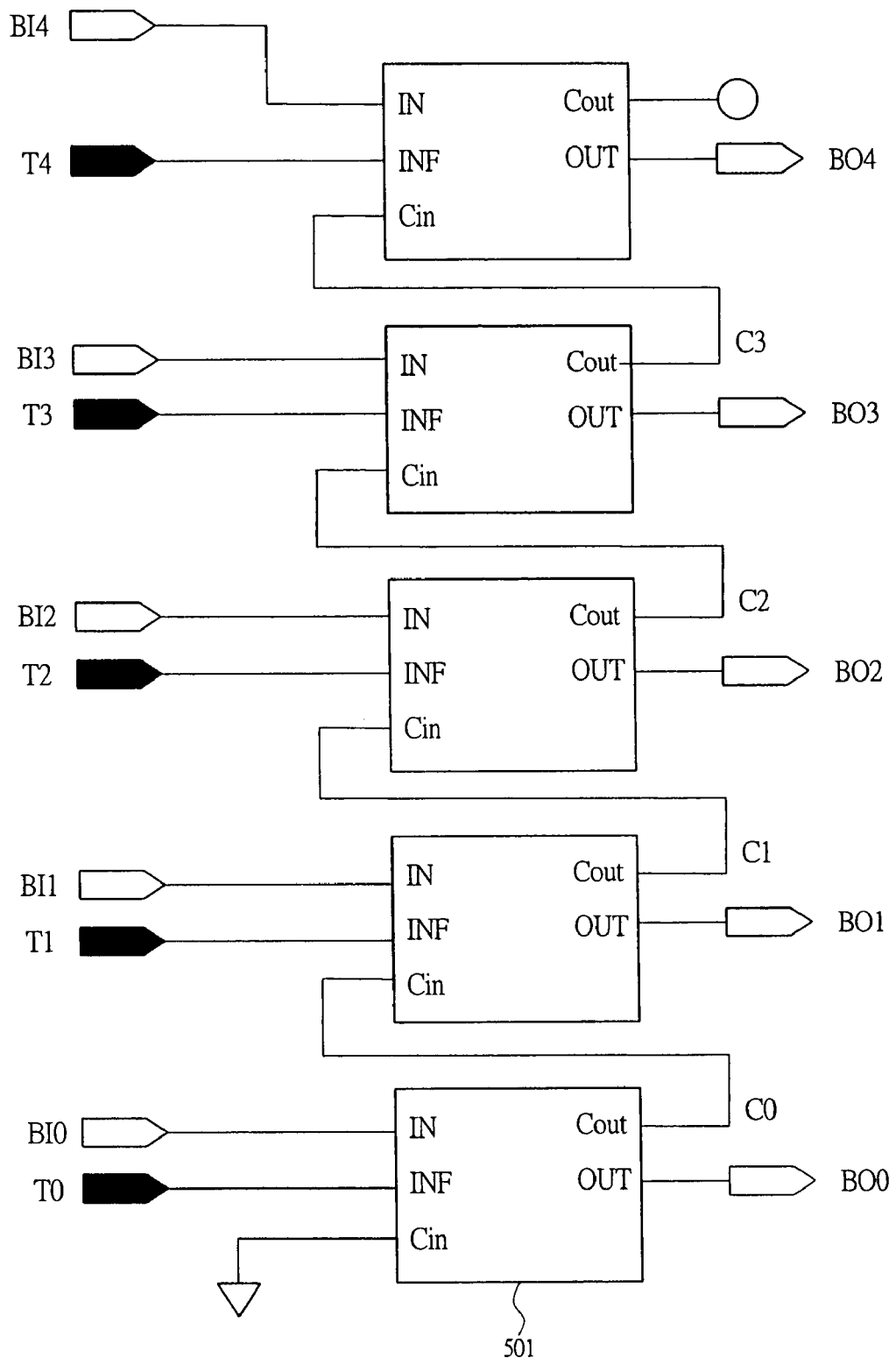
FIG. 5 is a diagram showing an example of a structure of a bit shift circuit functioning as the control circuit in FIG. 4.

FIG. 5 is a diagram showing an example of the structure of the bit shift circuit corresponding to the control circuit 305 in FIG. 4. In this example, the bit shift circuit is composed of a plurality of full adders 501.

Figure 6:
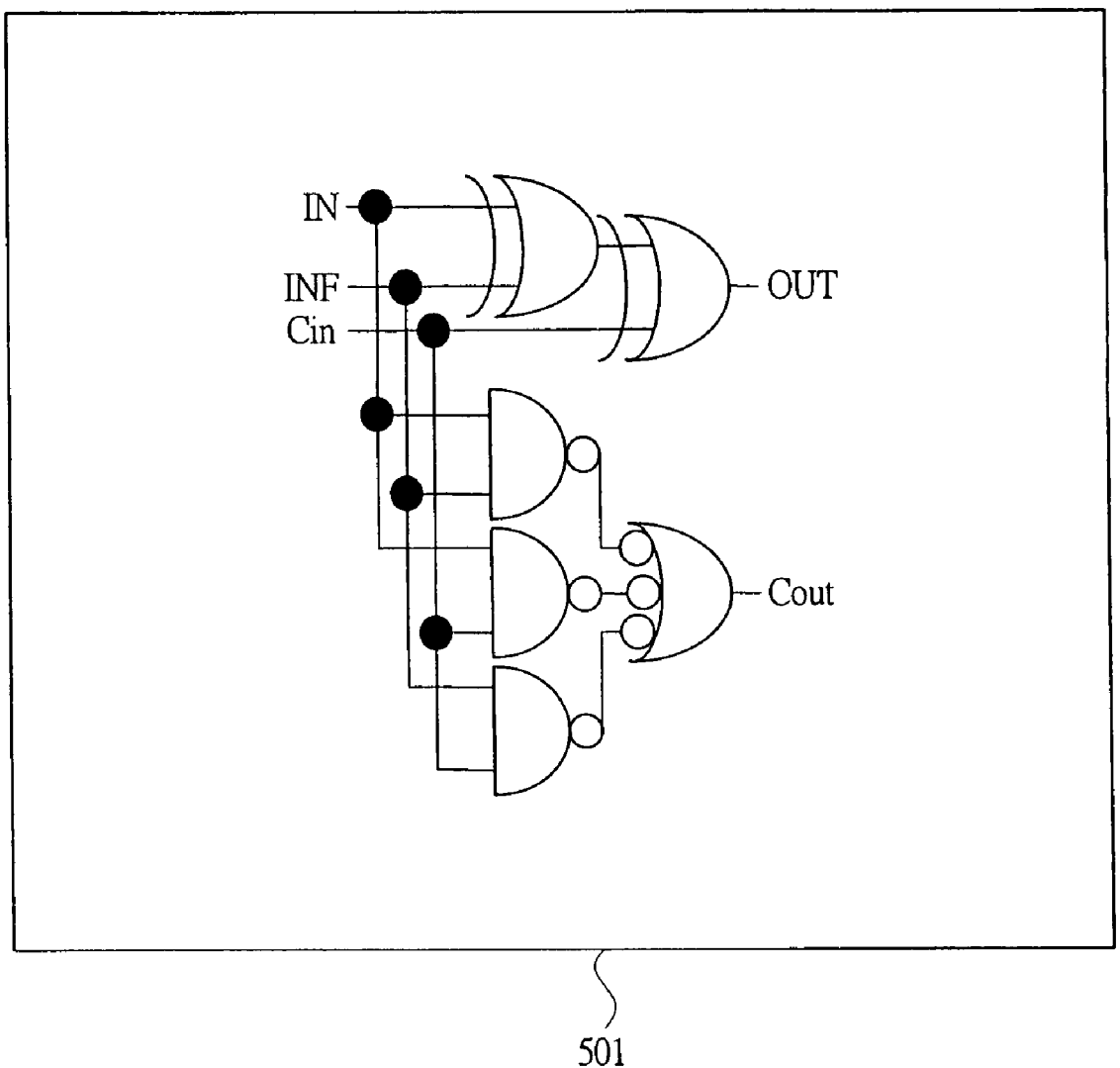
FIG. 6 is a diagram showing an example of a structure of the full adder in FIG. 5.

FIG. 6 is a diagram showing an example of the structure of the full adder in FIG. 5, which is composed of exclusive OR gates, logical AND gates, and others.

Figure 7:
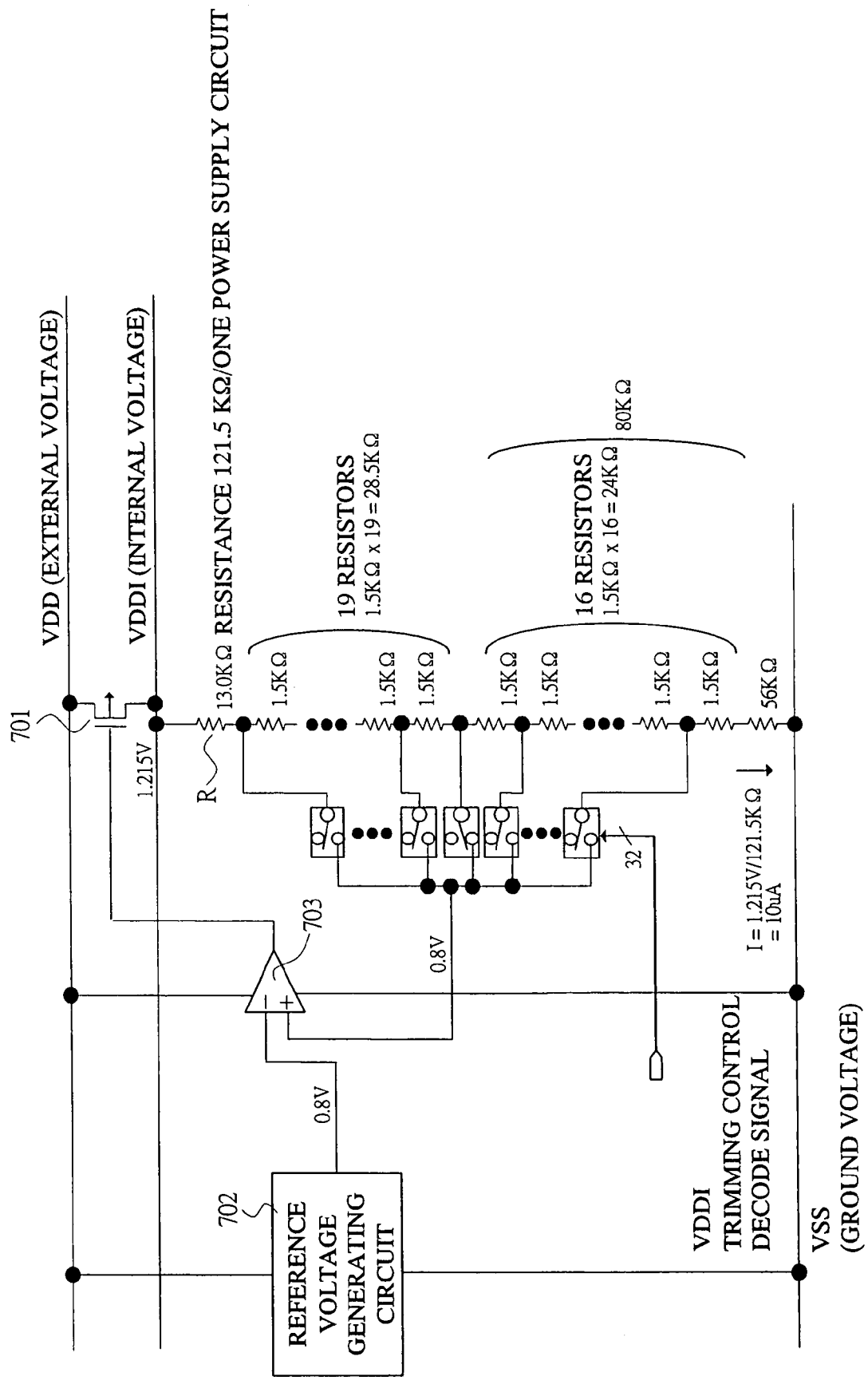
FIG. 7 is a diagram showing an example of a structure of a voltage step-down circuit which can switch an internal voltage to 32 levels based on the decoder output (VDDI trimming control decode signal) in FIG. 4.

FIG. 7 shows an example of the structure of a voltage step-down circuit which can switch the internal voltage to 32 levels based on the outputs of the decoder 301 (G0 to G31) in FIG. 4. In this circuit, the external voltage VDD is stepped down by a driver PMOS 701 to generate the internal voltage VDDI. This internal voltage VDDI is divided by a plurality of resistors R. This voltage and the voltage generated by a reference voltage generating circuit 70 are compared and amplified in a differential amplifier 703, and the feedback control of the impedance of the driver PMOS 701 is performed. By doing so, the internal voltage VDDI is controlled to a desired value. In this case, the outputs of the decoder 301 (G0 to G31) in FIG. 4 are inputted as the VDDI trimming control decode signals in FIG. 7, the signals control the voltage division ratio by the resistors R, and thus, the internal voltage VDDI can be switched to 32 levels.

Figure 8:
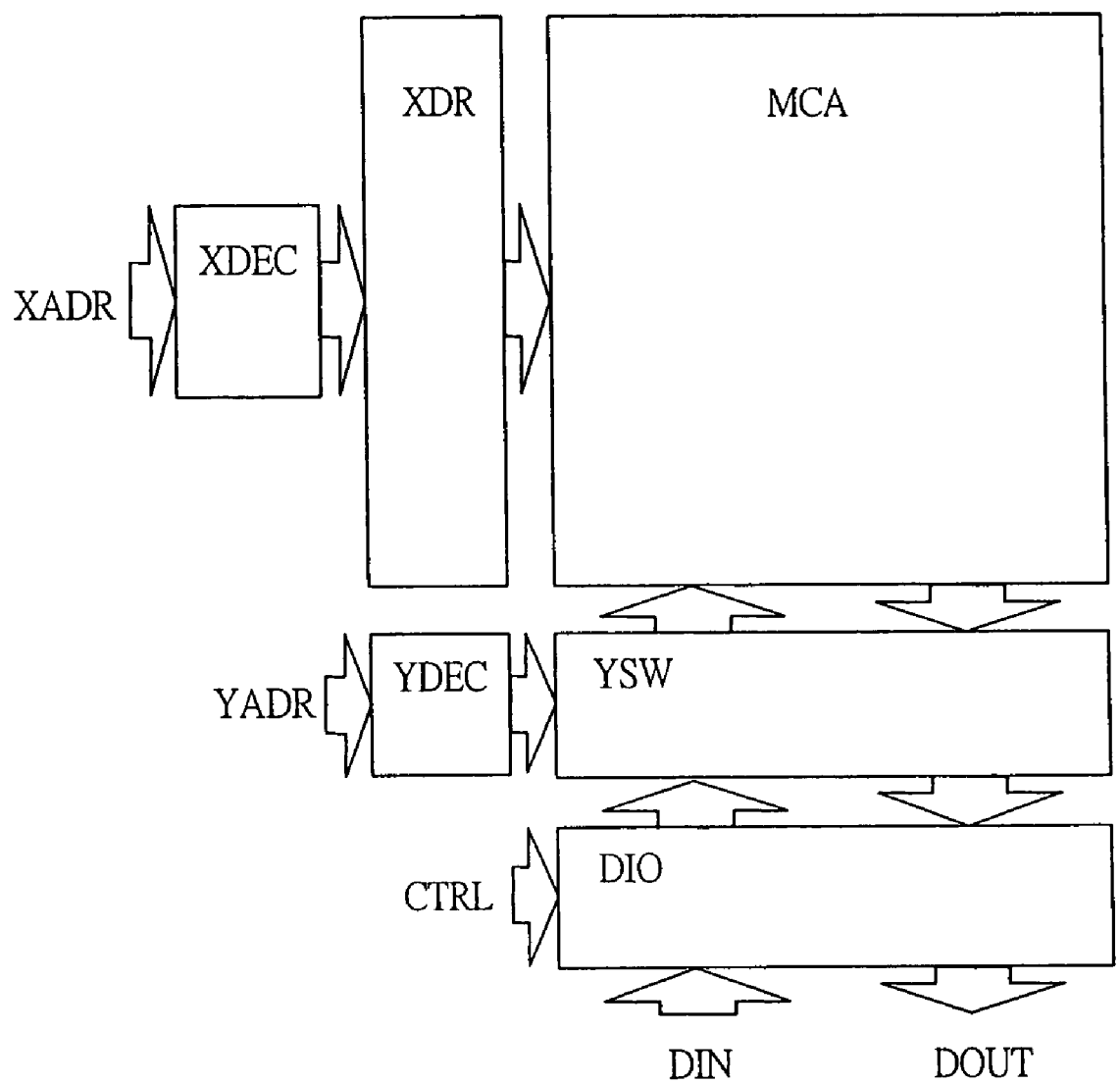
FIG. 8 is a diagram showing an example of a structure of a semiconductor memory to which the trimming circuit in FIG. 3 is applied.

FIG. 8 is a diagram showing an example of the structure of a semiconductor memory (semiconductor memory device) to which the trimming circuit according to this embodiment is applied. In FIG. 8, XADR denotes a row address signal, YADR denotes a column address signal, DIN denotes a data input signal, CTRL denotes a memory control signal, and DOUT denotes a data output signal. Also, XDEC denotes a row address decoder, XDR denotes a word line driver which applies a selection pulse voltage to a corresponding word line, and MCA denotes a memory cell array in which a plurality of memory cells are arranged in matrix. Furthermore, YDEC denotes a column address decoder, YSW denotes a column selection circuit which selects a bit line pair corresponding to the column address, and DIO denotes a data I/O circuit which writes a data input signal DIN to a selected cell or amplifies the information of the selected cell to output the data output signal DOUT based on the memory control signal CTRL.

The internal voltage of the voltage step-down circuit in FIG. 7 is controlled by the trimming circuit shown in FIG. 3 and FIG. 4, and the internal voltage is supplied to each block in the semiconductor memory in FIG. 8. In this case, the internal voltage generated from the voltage step-down circuit of this embodiment may be applied to all of the blocks or to some of the blocks.

Figure 9:
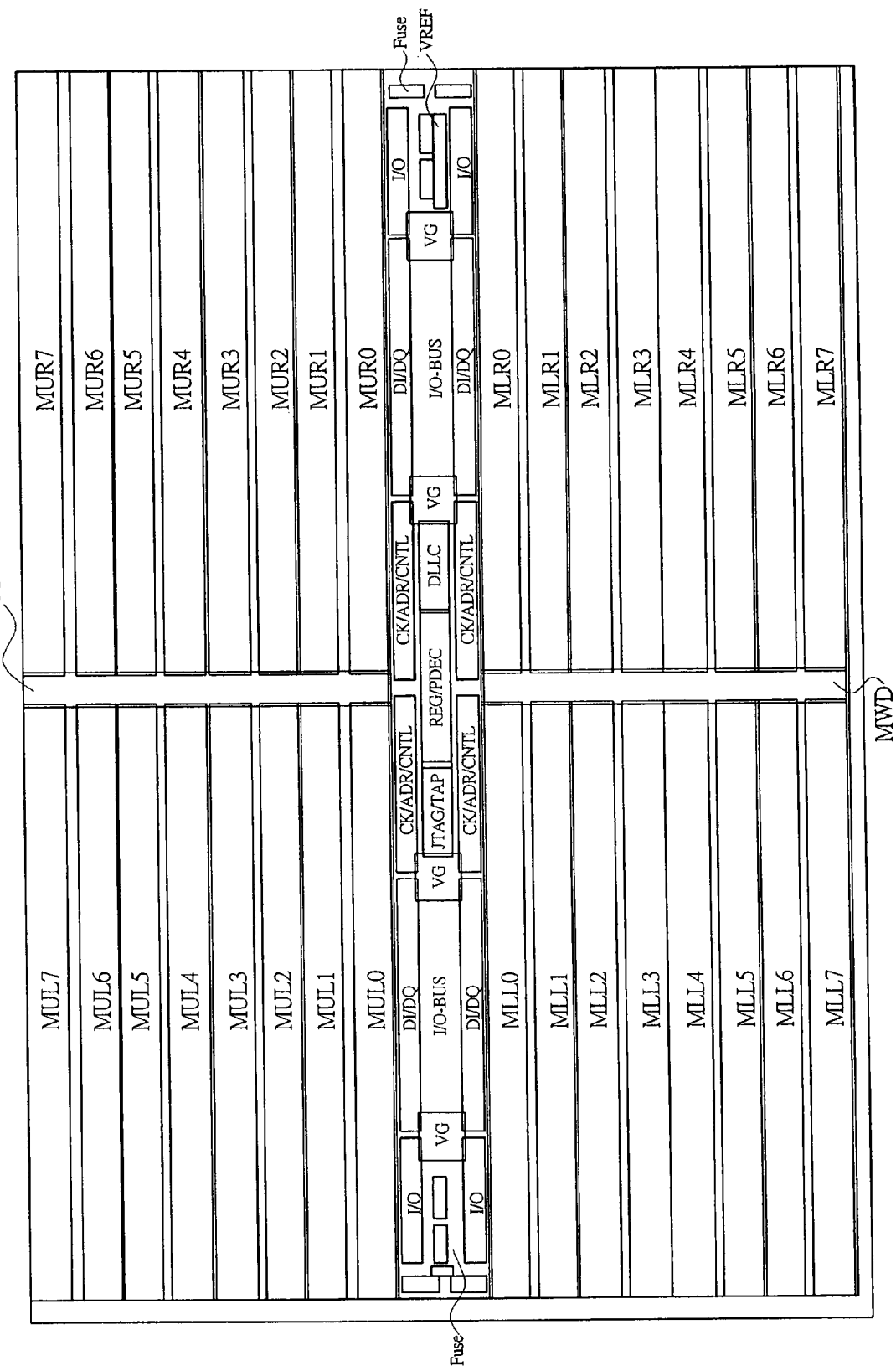
FIG. 9 is a block diagram showing an example of a structure of a SRAM to which the trimming circuit in FIG. 3 is applied.

FIG. 9 is a diagram showing an example of the structure of a SRAM (Static Random Access Memory) to which the trimming circuit according to this embodiment is applied, in which a geometric arrangement example of the circuit blocks formed on a semiconductor substrate is shown. In FIG. 9, MUL0 to MUL7, MUR0 to MUR7, MLL0 to MLL7, and MLR0 to MLR7 denote memory cell arrays in which memory cells are arranged in an array, and MWD denotes a main word driver. Also, CK/ADR/CNTL denotes an input circuit of a clock signal, an address signal, and memory control signal, DI/DQ denotes a data I/O circuit, and I/O denotes an I/O circuit of a mode switching signal, a test signal, and a DC signal. This example shows the case of a center pad structure, and therefore, the CK/ADR/CNTL circuit, the DI/DQ circuit, and the I/O circuit are located at the center of the chip. Also, REG/PDEC denotes a pre-decoder and others, DLLC denotes a synchronization circuit of the clocks, JTAG/TAP denotes a test circuit, and VG denotes an internal power supply voltage generating circuit. Fuse denotes the fuse circuit, which is used for the recovery of memory array defects. VREF generates reference voltage or the like for taking the input signals.

For example, the pad unit 302 in FIG. 3 is disposed in the I/O unit or in the vicinity thereof, the fuse circuit unit 303 is disposed in the Fuse unit or in the vicinity thereof, and the JTAG function unit 304 is disposed in the JTAG/TAP unit or in the vicinity thereof. Also, the control circuit 305 and the decoder 301 are disposed in the JTAP/TAP unit, the VG unit, or in the vicinity thereof. Furthermore, the voltage step-down circuit in FIG. 7 is disposed in the VG unit or in the vicinity thereof.

Figure 21A:
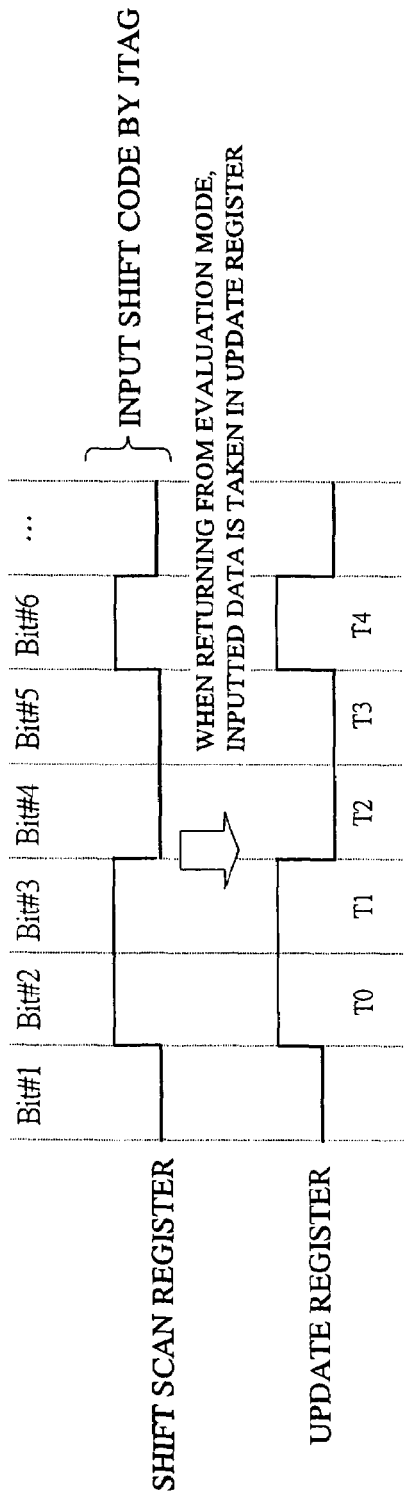
FIG. 21A is an explanatory diagram showing an operation of the trimming circuit in FIG. 4.
Figure 21B:
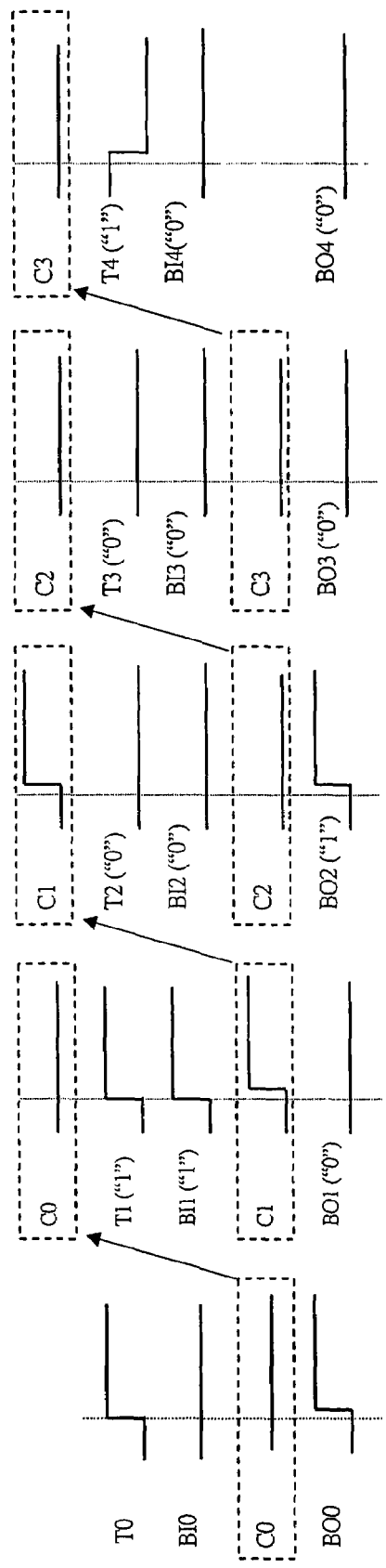
FIG. 21B is an explanatory diagram showing an operation of the trimming circuit in FIG. 4.

FIG. 21 is an explanatory diagram showing the operation of the internal power supply trimming by the JTAG function, in which the bit shift circuit (control circuit 305) shown in FIG. 5 is used. FIG. 21 shows the case of the pseudo trimming in which the trimming grade 18 by the fuse (G18: fuse cutting code 01000) is shifted by "+3" grade to the trimming grade 21 (G21: 10100). FIG. 21A shows the data inputted to each shift scan register 403 and taken in each update register 404 in the JTAG function unit 304. FIG. 21B shows the operation of each full adder 501 in the bit shift circuit (control circuit 305). Note that T0 to T4 denote the outputs (shift code) of each update register 404, BI0 to BI4 denote the outputs (fuse cutting code) of each fuse circuit 402, C0 to C3 denote carry outputs Cout of each full adder 501, and BO0 to BO4 denote the output OUT (code showing the trimming grade after the shift) of each full adder 501.

FIG. 22 is a diagram showing the internal voltage trimming table, and "1" denotes a state where the fuse is cut.

FIG. 23 is a diagram showing the internal voltage JTAG shift code table. As a VDDI trimming code shift function, a function to shift the grade of the fuse trimming code by the number of designated grades is provided, and the number of grades that can be shifted differs depending on the trimming code of the fuse cut and is restricted as shown in the right side of the table.

Next, the operation of the trimming circuit according to this embodiment will be described with reference to FIG. 21 to FIG. 23.

First, a normal operation mode is switched to an evaluation mode by using a package terminal defined by the JTAG standard.

Next, the codes to be shifted to the values subjected to the fuse trimming in advance are sequentially inputted to the shift scan register 403 in accordance with the JTAG shift code table in FIG. 23 (scan in).

For example, in the trimming by the fuse trimming, when the internal power supply voltage VDDI set to G18 (grade 18) in the internal voltage trimming table shown in FIG. 22 in advance is to be changed to G21 (grade 21) by the pseudo trimming (temporary trimming) by the JTAG, the JTAG code (shift code) corresponding to the shift grade number "+3" is inputted to the shift register 403.

Next, the mode is returned from the evaluation mode to the normal operation mode. When returning from the evaluation mode, the inputted data is taken in the update register 404.

Then, at the same time when the inputted shift code is taken in the update register 404, logical values of the outputs BI0 to BI4 of each fuse circuit 402 (fuse trimming) and the outputs T0 to T4 of each update register (shift code) are obtained in the bit shift circuit (control circuit 305) in FIG. 5, and codes BO0 to BO4 representing the trimming grade after the shift are outputted. The codes BO0 to BO4 are inputted to the decoder 301 as RGC0 to RGC4, and the signals (G0 to G31) which switch the internal voltage to a desired voltage are generated.

In this embodiment, the desired voltages of 32 levels are prepared, and a corresponding number of the fuses and shift codes are provided. However, the number of levels of the voltage can be arbitrary selected by a designer, and the number of fuses and shift codes can also be selected in accordance with the number of voltage levels.

Therefore, according to the semiconductor memory device and the semiconductor device in this embodiment, the internal voltage generated by the voltage step-down circuit is measured in the stage of the wafer test, and when the measured value is deviated from the design value due to the variation in properties of the transistors, the internal voltage can be adjusted so as to be close to the design value by the fuse trimming. Therefore, it is possible to improve the yield.

Also, in the sorting process, the evaluation can be performed while changing the internal voltage by the trimming signal by the JTAG function, and the samples with small margin can be screened. Furthermore, the parallel testing of a large number of samples (batch processing in a tester) can be easily realized.

In the foregoing, the invention made by the inventors of the present invention has been described in detail based on the embodiment relating to the trimming of the internal power supply voltage. However, the present invention is not limited to the trimming of the internal power supply voltage, but various modifications and alterations can be made within the scope of the present invention. For example, the present invention can be applied also to the trimming of internal reference voltage such as the reference voltage in the input buffer which receives external signals. Further, it can be applied to the trimming of a switching timing of the internal signal such as an activation timing in the sense amplifier of the memory and to the trimming of a pulse width of the internal signal such as a selection pulse width of the word line selection signal in the memory. Hereinafter, embodiments of these trimmings will be described in concrete.

Figure 10:
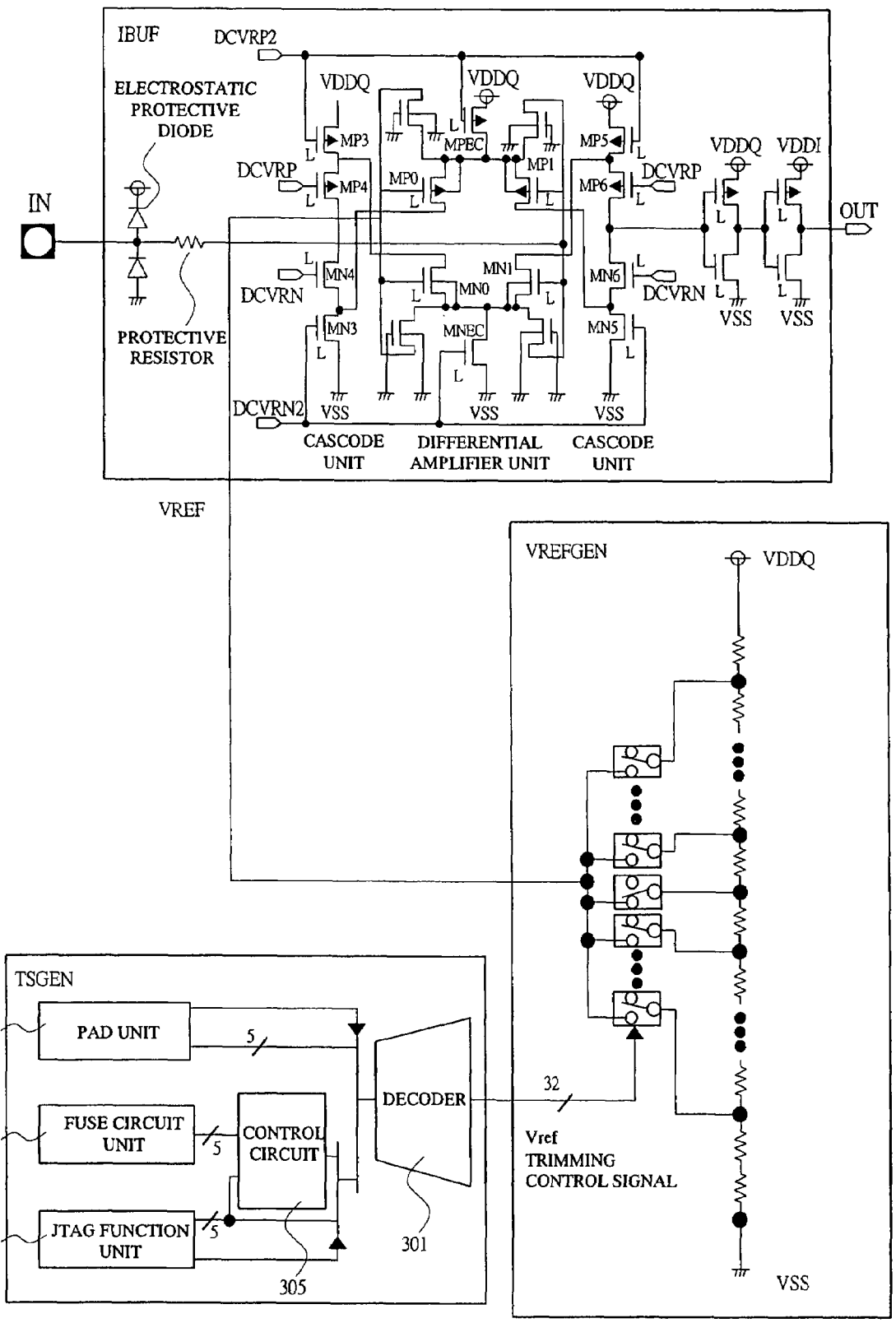
FIG. 10 is a diagram showing an example in which the trimming circuit in FIG. 3 is applied to a trimming of reference voltage of an input buffer.

FIG. 10 shows an example in which the present invention is applied to the trimming of reference voltage of an input buffer which receives the external signals. In FIG. 10, IBUF denotes an input buffer which receives the external signals, IN denotes an external input signal, and OUT denotes an output signal of the input buffer. The input buffer IBUF includes a differential amplifier which amplifies the input signal IN, and reference voltage VREF is inputted to the differential amplifier. The reference voltage VREF is generated in a reference voltage generating circuit VREFGEN. TSGEN denotes a control circuit which controls the voltage generated by the reference voltage generating circuit VREFGEN. The control circuit TSGEN generates a control signal which can control the reference voltage based on the result of logical operation of the fuse signal and the trimming signal by the JTAG function. More specifically, the control circuit TSGEN identifies the state of the fuse trimming performed in the stage of the wafer test, and based on the reference voltage in this state, it generates the control signal which changes the reference voltage by the trimming signal by the JTAG function.

Figure 11:
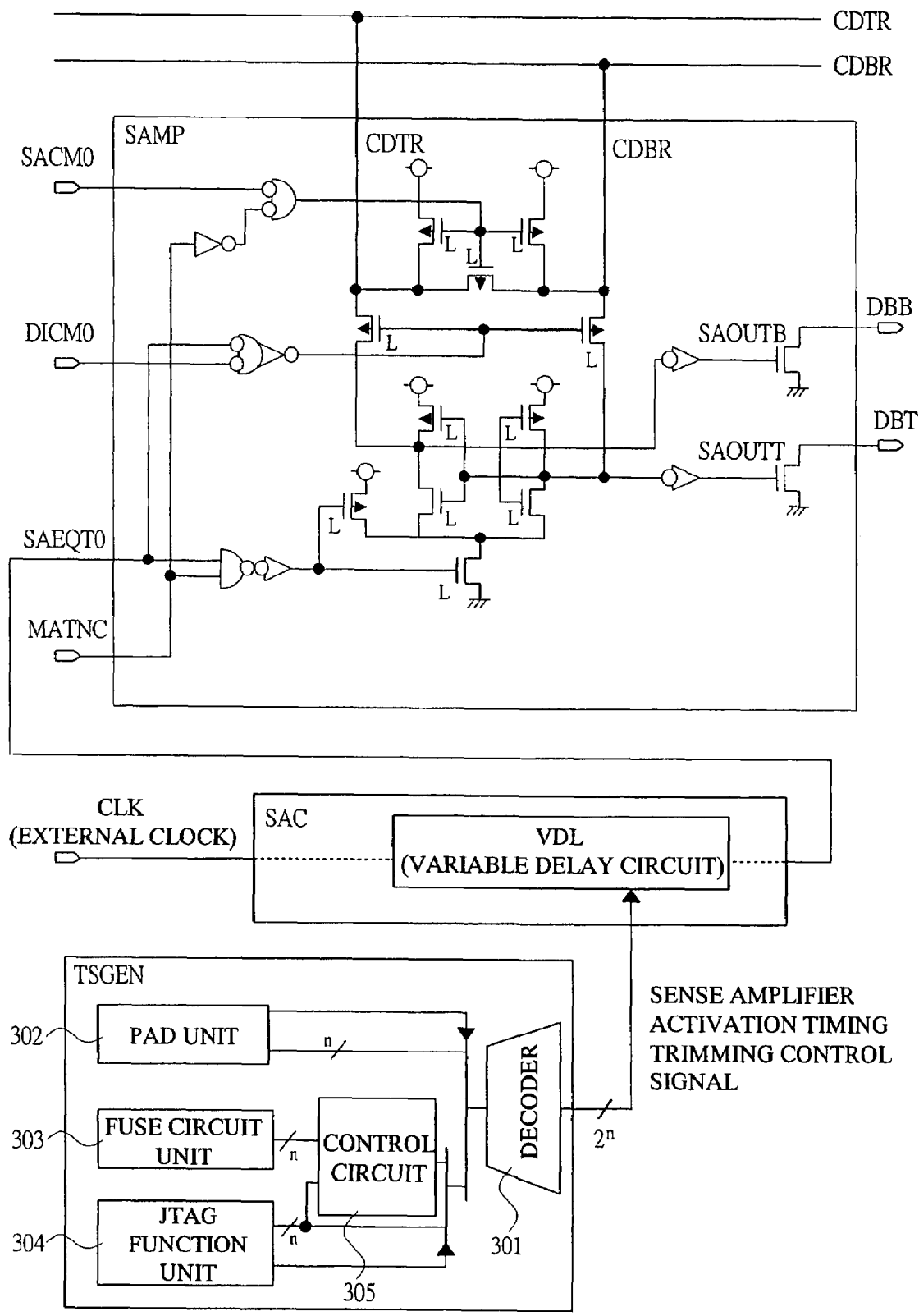
FIG. 11 is a diagram showing an example in which the trimming circuit in FIG. 3 is applied to a trimming of an activation timing of a sense amplifier in a memory.

FIG. 11 shows an example in which the present invention is applied to the trimming of activation timing of a sense amplifier of a memory. In FIG. 11, SAMP denotes a sense amplifier of a memory, CDTR and CDBR denote common data lines through which read data from the memory cell is transmitted, and DBB and DBT denote output signals of the sense amplifier SAMP. In addition, SACM0, DICM0, and MATNC denote control signals which control the sense amplifier. Furthermore, SAEQT0 denotes an activation signal which activates the sense amplifier. The activation signal SAEQT0 is generated in a sense amplifier activation signal generating circuit SAC. The sense amplifier activation signal generating circuit SAC includes a variable delay circuit VDL, and the timing of activating the sense amplifier can be changed by varying the delay time of the variable delay circuit VDL. TSGEN denotes a control circuit which controls the timing of the signals generated by the sense amplifier activation signal generating circuit SAC. This control circuit TSGEN generates a control signal which can control the timing based on the result of the logical operation of the fuse signal and the trimming signal by the JTAG function. More specifically, the control circuit TSGEN identifies the state of the fuse trimming performed in the stage of the wafer test, and based on the timing in this state, it generates the control signal which changes the timing by the trimming signal by the JTAG function. Note that n is a natural number and represents the number of signal lines. In the embodiment described above, n=5.

Figure 12:
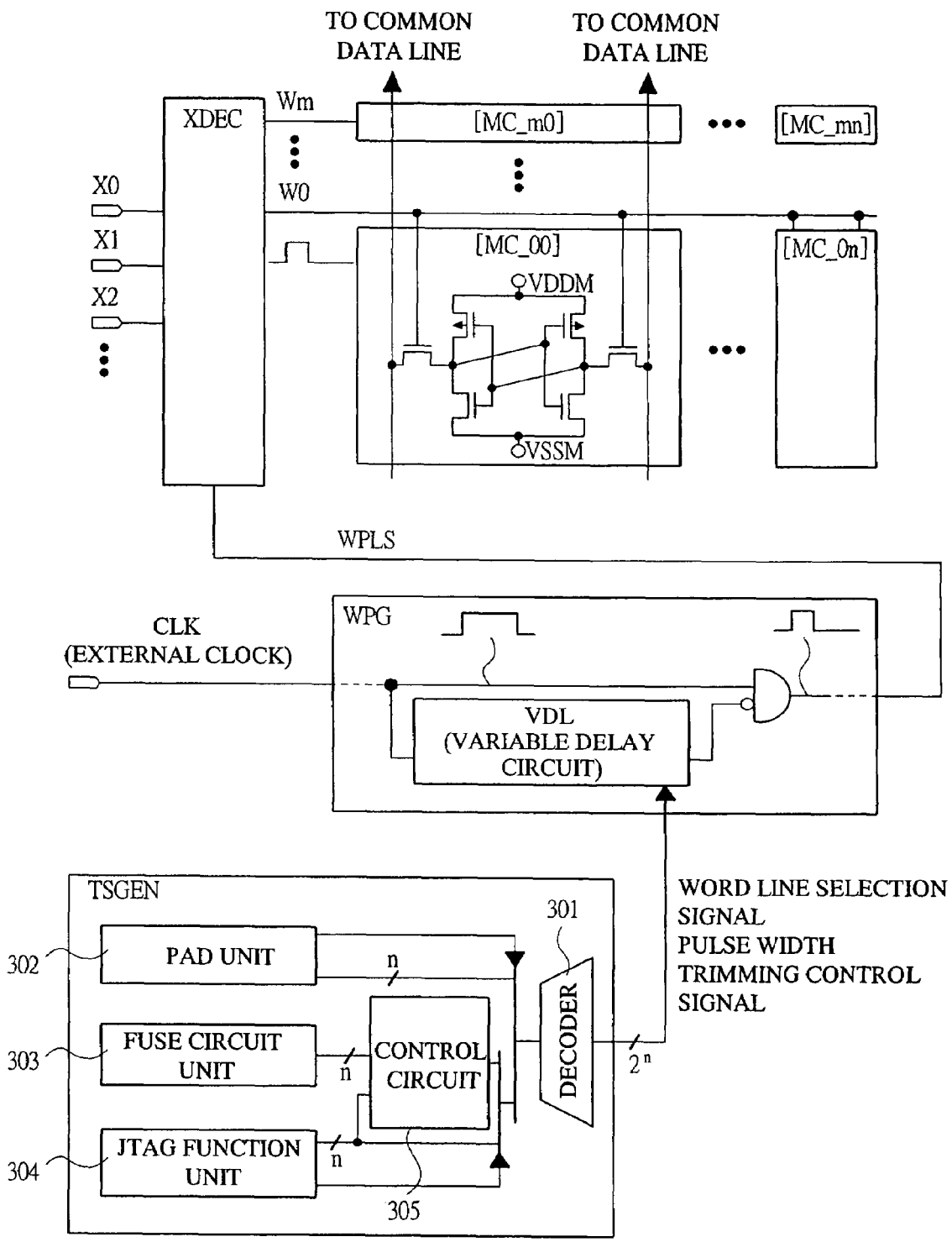
FIG. 12 is a diagram showing an example in which the trimming circuit in FIG. 3 is applied to a trimming of a selection pulse width of a word line selection signal in a memory.

FIG. 12 shows an example in which the present invention is applied to the trimming of selection pulse width of a word line selection signal in a memory. In FIG. 12, MC_00, MC_m0, MC_0n, and MC_mn denote memory cells constituting a memory, and W0 to Wm denote word lines. X0, X1, X2 . . . denote row address signals, XDEC denotes a row address decoder, and the row address decoder XDEC selects one word line from the word lines Wo to Wm based on the values of the row address signals X0, X1, X2 . . . . Also, a selection pulse WPLS of the word line selection signal is applied to the row address decoder XDEC, and the row address decoder XDEC generates a selection signal having a pulse width in proportion to the pulse width of the selection pulse WPLS to one of the word lines W0 to Wm. The selection pulse WPLS is generated in a selection pulse generating circuit WPG. The selection pulse generating circuit WPG includes a variable delay circuit VDL, and the pulse width of the selection pulse can be changed by varying the delay time of the variable delay circuit VDL. TSGEN denotes a control circuit which controls the pulse width of the selection pulse generated by the selection pulse generating circuit WPG. This control circuit TSGEN generates a control signal which can control the pulse width based on the result of the logical operation of the fuse signal and the trimming signal by the JTAG function. More specifically, the control circuit TSGEN identifies the state of the fuse trimming performed in the stage of the wafer test, and based on the pulse width in this state, it generates the control signal which changes the pulse width by the trimming signal by the JTAG function.

Figure 13:
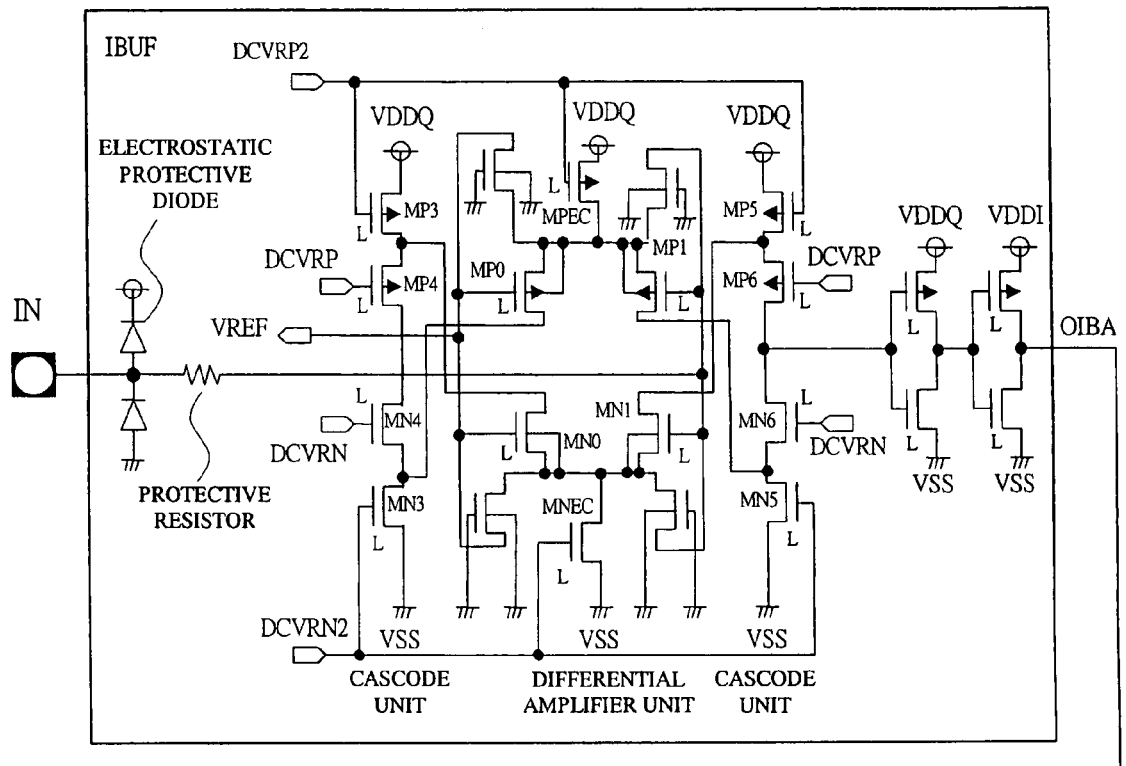
FIG. 13 is a diagram showing an example in which the trimming circuit in FIG. 3 is applied to a trimming of a setup/hold timing adjustment circuit of an input buffer.

FIG. 13 shows an example in which the present invention is applied to the trimming of setup/hold timing of an input buffer which receives external signals. In FIG. 13, IBUF denotes an input buffer which receives an external signal, IN denotes an external input signal, and OIBA denotes an output signal of the input buffer. The input buffer output signal OIBA is inputted to a setup/hold timing adjustment circuit SHC. The setup/hold timing adjustment circuit SHC includes a variable delay circuit VDL, and the setup/hold timing can be changed by varying the delay time of the variable delay circuit VDL. TSGEN denotes a control circuit which controls the timing of the pulse generated by the setup/hold timing adjustment circuit SHC. This control circuit TSGEN generates a control signal which can control the timing based on the result of the logical operation of the fuse signal and the trimming signal by the JTAG function. More specifically, the control circuit TSGEN identifies the state of the fuse trimming performed in the stage of the wafer test, and based on the timing in this state, it generates the control signal which changes the timing by the trimming signal by the JTAG function.

FIG. 14 to FIG. 20 are diagrams showing the examples of the structure of the variable delay circuit VDL in FIG. 11 to FIG. 13. In each of the diagrams, IN denotes an input of the delay circuit, and OUT denotes an output of the delay circuit.

Figure 14:
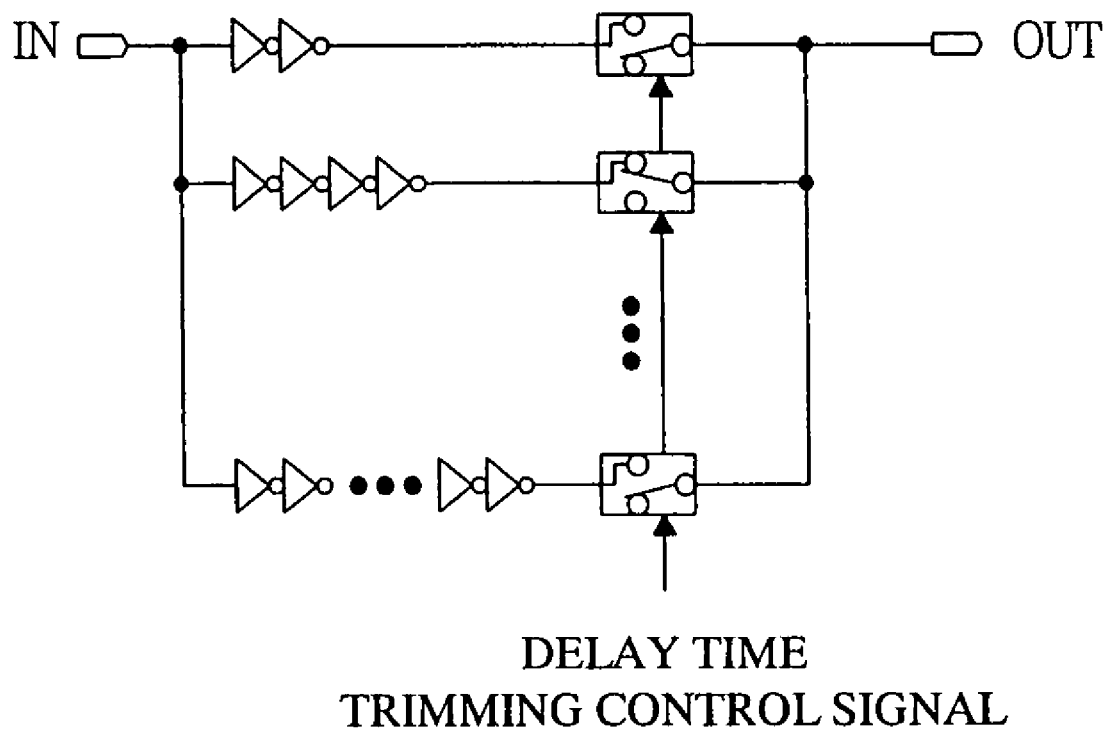
FIG. 14 is a diagram showing an example of a structure of the variable delay circuit in FIG. 11 to FIG. 13.

In the variable delay circuit VDL in FIG. 14, the switch to be turned on is selected from a plurality of the switches by the delay time trimming control signal (output of the decoder 301) to switch the number of the inverters, thereby controlling the delay time.

Figure 15:
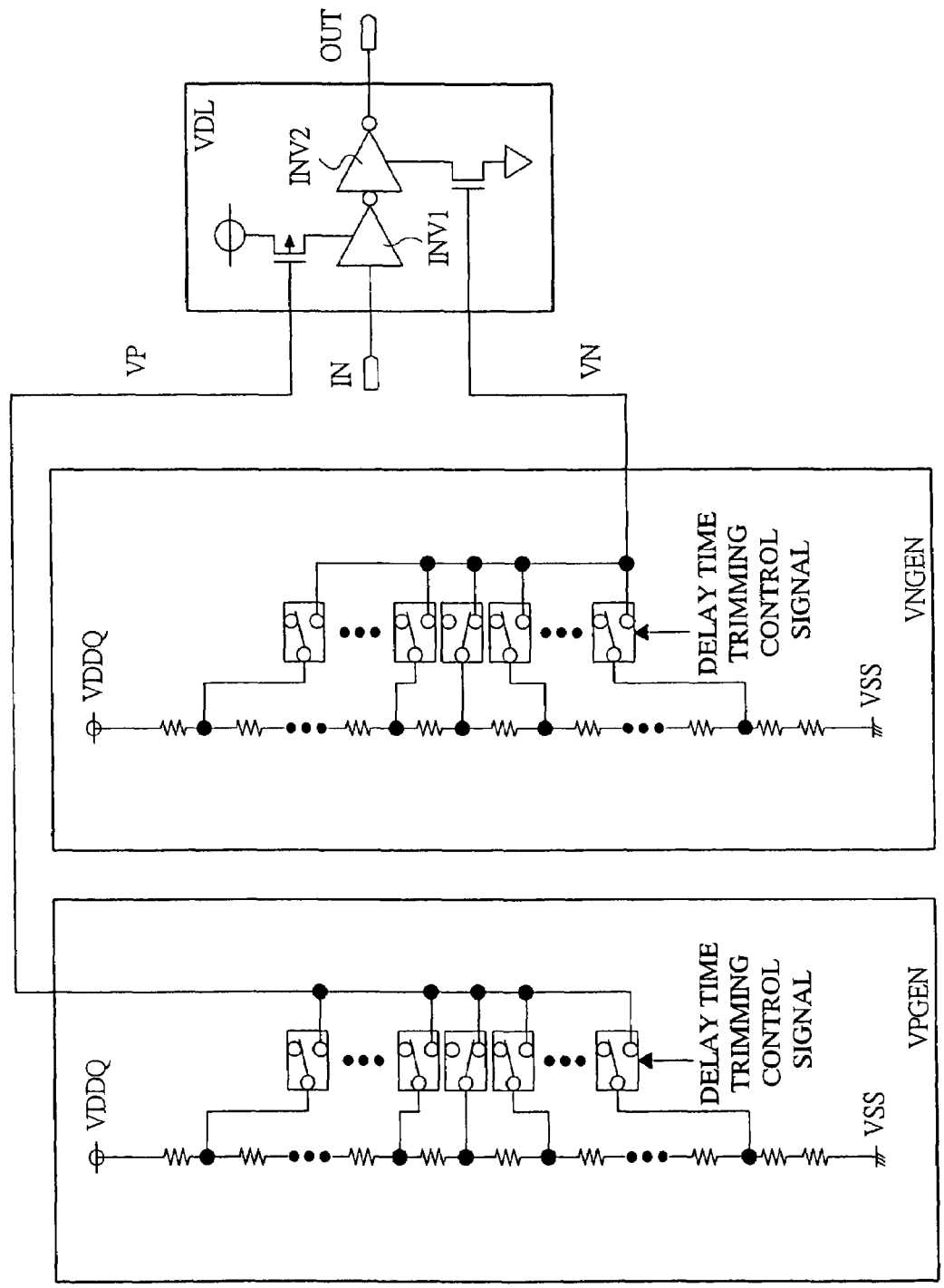
FIG. 15 is a diagram showing an example of a structure of the variable delay circuit in FIG. 11 to FIG. 13.

In the variable delay circuit VDL in FIG. 15, a potential level of the control signals Vp and Vn is controlled by the delay time trimming control signal (output of the decoder 301) to switch the equivalent impedance of the inverters INV1 and INV2, thereby controlling the delay time.

Figure 16:
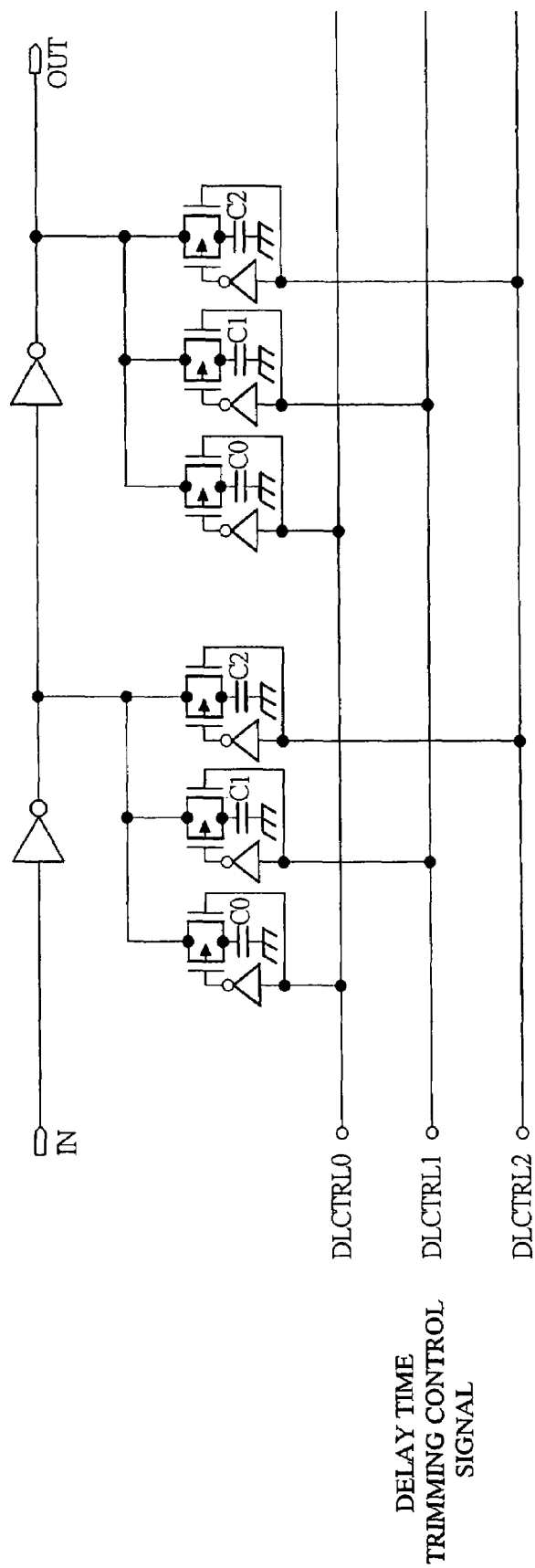
FIG. 16 is a diagram showing an example of a structure of the variable delay circuit in FIG. 11 to FIG. 13.

In the variable delay circuit VDL in FIG. 16, load capacitance of each inverter is switched by the delay time trimming control signals DLCTRL0 to DLCTRL2 (input and output of the decoder 301), thereby controlling the delay time.

Figure 17:
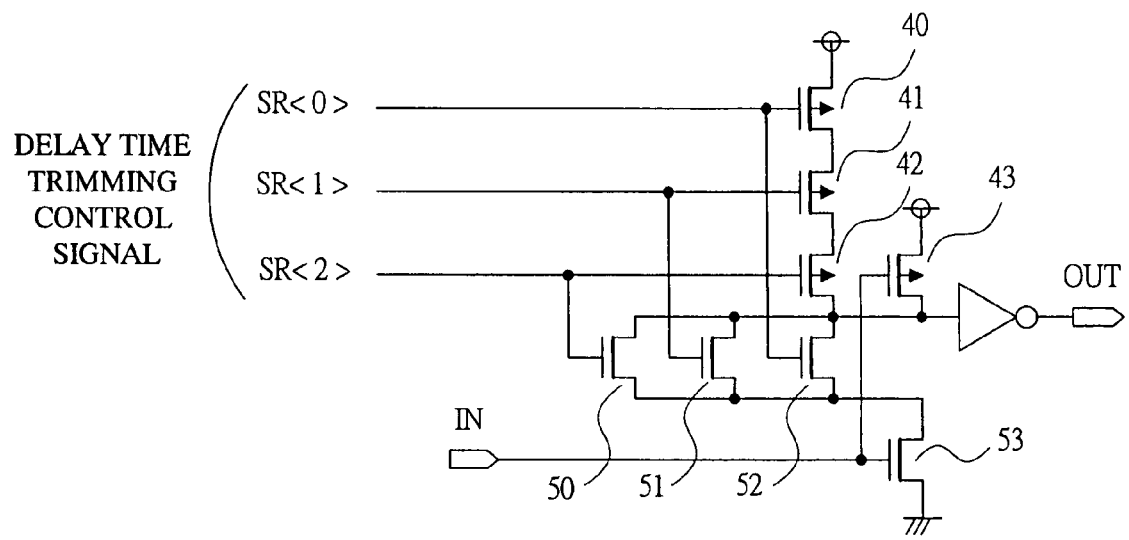
FIG. 17 is a diagram showing an example of a structure of the variable delay circuit in FIG. 11 to FIG. 13.

In the variable delay circuit VDL in FIG. 17, a combination of MOSFETs to be turned on is selected from N channel MOSFETs 50 to 52 by the delay time trimming control signals SR<0>, SR<1>, and SR<2> to change load driving power (ON resistance) of the circuit, thereby controlling the delay time.

Figure 18:
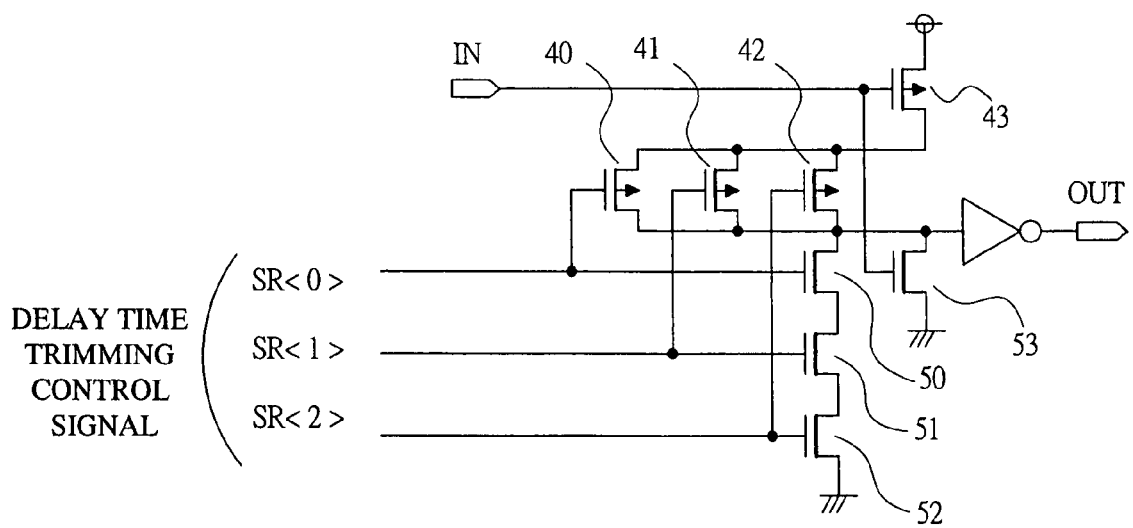
FIG. 18 is a diagram showing an example of a structure of the variable delay circuit in FIG. 11 to FIG. 13.

In the variable delay circuit VDL in FIG. 18, a combination of MOSFETs to be turned on is selected from P channel MOSFETs 40 to 42 by the delay time trimming control signals SR<0>, SR<1>, and SR<2> to change load driving power (ON resistance) of the circuit, thereby controlling the delay time.

Figure 19:
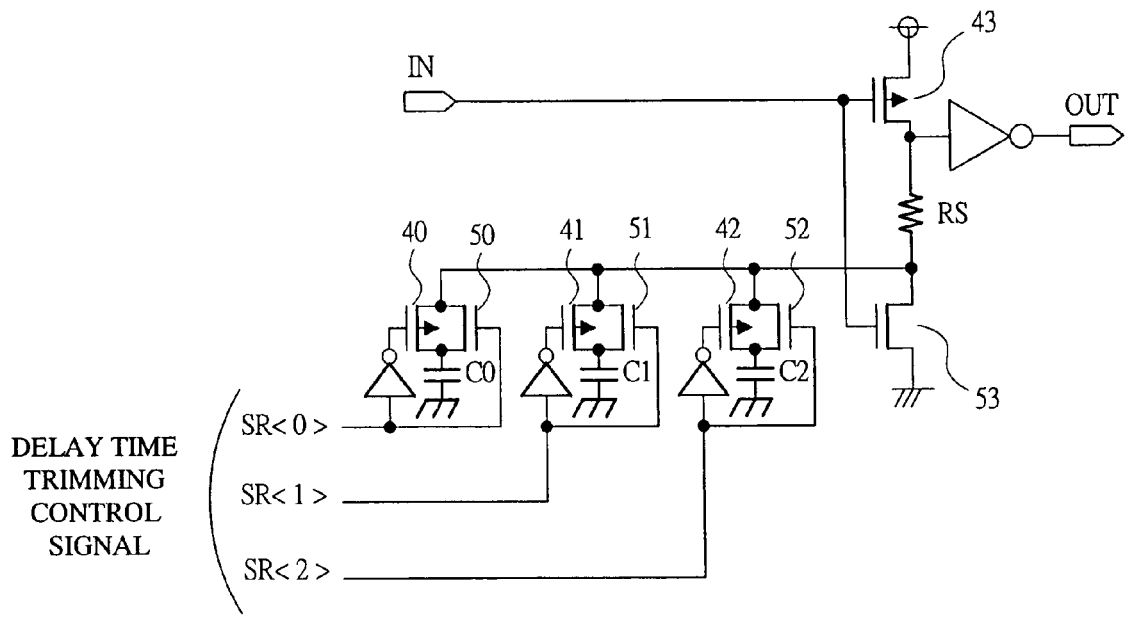
FIG. 19 is a diagram showing an example of a structure of the variable delay circuit in FIG. 11 to FIG. 13.

In the variable delay circuit VDL in FIG. 19, a combination of P channel MOSFET and N channel MOSFET to be turned on is selected from P channel MOSFETs 40 to 42 and N channel MOSFETs 50 to 52 and a combination of capacitors to be connected to a drain node of a N channel MOSFET 53 is selected from capacitors C0 to C2 by the delay time trimming control signals SR<0>, SR<1>, and SR<2>. By doing so, a time constant of the drain node of the N channel MOSFET 53 is changed to control the delay time.

Figure 20:
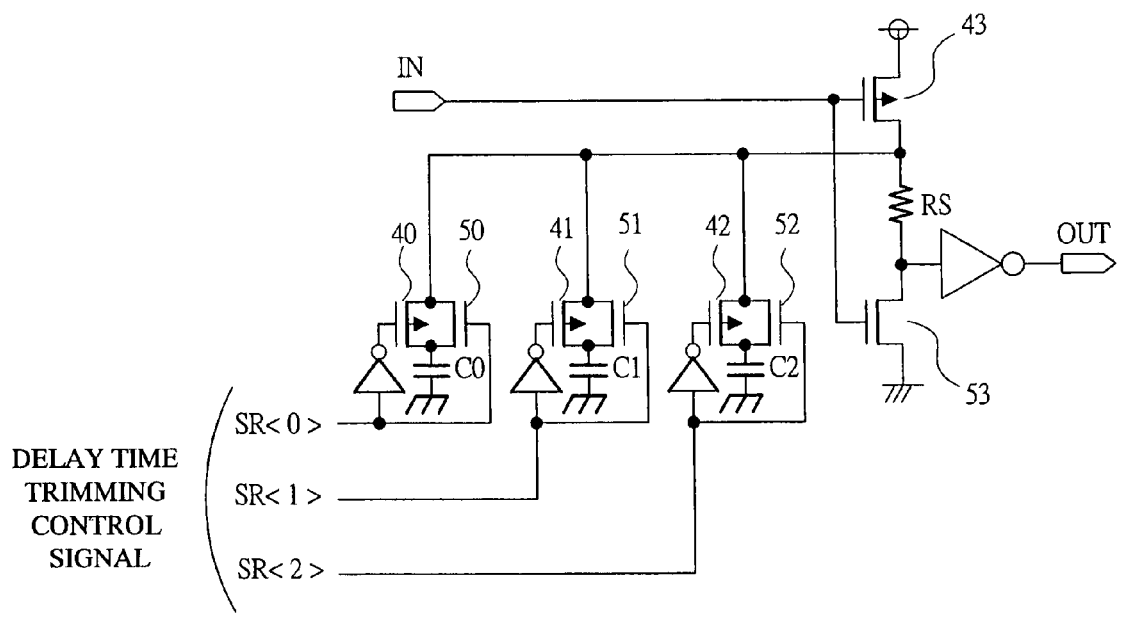
FIG. 20 is a diagram showing an example of a structure of the variable delay circuit in FIG. 11 to FIG. 13.

In the variable delay circuit VDL in FIG. 20, a combination of P channel MOSFET and N channel MOSFET to be turned on is selected from P channel MOSFETs 40 to 42 and N channel MOSFETs 50 to 52 and a combination of capacitors to be connected to a drain node of a P channel MOSFET 43 is selected from capacitors C0 to C2 by the delay time trimming control signals SR<0>, SR<1>, and SR<2>. By doing so, a time constant of the drain node of the P channel MOSFET 43 is changed to control the delay time.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the embodiments described above, the case where the present invention is applied to a semiconductor memory device such as a SRAM has been described. However, the application of the present invention is not limited to this, but it can be applied also to a CPU or a semiconductor device such as a so-called on-chip memory which includes a block of an analog circuit (one-chip microcomputer and the like) other than the memory.

The present invention can be applied to a memory LSI, logic LSI, microcomputer and others, which use a voltage step-down circuit (voltage step-up circuit).

What is claimed is:

1. A semiconductor memory device comprising:
a first circuit whose property values are variable in accordance with signal values inputted;
a program circuit having a program element being selectively programmed, the program circuit outputting a property changing signal changing said property values in accordance with a program;
a second circuit which inputs and retains an external signal serving as a signal for IEEE standard 1149.1 proposed by JTAG; and
a third circuit changing an output-signal of said second circuit based on the property changing signal of said program circuit to output to said first circuit,
wherein said first circuit is an internal voltage circuit which decreases voltage supplied from outside, and said property value is an output voltage of the internal voltage circuit.

2. The semiconductor memory device according to claim 1, wherein said program element is a fuse.

3. The semiconductor memory device according to claim 1, wherein said semiconductor memory device is a SRAM.

4. The semiconductor memory device according to claim 1, wherein said first circuit is a switch timing generating circuit of an internal signal, and said property value is a timing generated by said switch timing generating circuit.

5. The semiconductor memory device according to claim 1, wherein said first circuit is an activation timing generating circuit of a sense amplifier, and said property value is a timing generated by said activation timing generating circuit.

6. The semiconductor memory device according to claim 1, wherein said first circuit is a signal pulse generating circuit, and said property value is a pulse width of a signal generated by said signal pulse generating circuit.

7. The semiconductor memory device according to claim 1, wherein said first circuit is a word line selection signal pulse generating circuit, and said property value is a pulse width of a signal generated by said word line selection signal pulse generating circuit.

* * * * *